United States Patent [19]

Heimer

[11] Patent Number: 4,474,463
[45] Date of Patent: Oct. 2, 1984

[54] MIXER COUPLING LENS SUBASSEMBLY FOR PHOTOLITHOGRAPHIC SYSTEM

[75] Inventor: Richard J. Heimer, Encino, Calif.

[73] Assignee: TRE Semiconductor Equipment Corporation, Woodland Hills, Calif.

[21] Appl. No.: 412,825

[22] Filed: Aug. 30, 1982

[51] Int. Cl.³ .............................................. G03B 27/72
[52] U.S. Cl. ........................................ 355/71; 355/74; 355/75
[58] Field of Search ....................... 355/40, 67, 71, 75, 355/74

[56] References Cited

U.S. PATENT DOCUMENTS

| | | | |
|---|---|---|---|
| 3,779,643 | 12/1973 | Nosco et al. | 355/75 |
| 3,909,130 | 9/1975 | Glaskov et al. | 355/40 |
| 3,941,475 | 2/1976 | Sheets | 355/71 X |
| 3,988,066 | 10/1976 | Suzuki et al. | 355/71 X |

OTHER PUBLICATIONS

Application of Variable Optics to Solar Simulation Systems for Generation of High Intensity Light Beams, Harris et al., AIAA Paper No. 69-997, 1969.

Primary Examiner—Richard A. Wintercorn
Attorney, Agent, or Firm—Spensley, Horn, Jubas & Lubitz

[57] ABSTRACT

A mask illumination system for use in the production of semiconductor devices includes an optical assembly having an internal focal plane corresponding to the mask. A reticle edge masking assembly (REMA) is located at the internal focal plane and serves to define a pattern of light which is projected onto the mask. The provision of the reticle edge masking assembly in a focal plane separate from the mask plane serves to reduce blurriness caused by near field diffraction, as well as facilitating the use of more complex REMA assemblies.

1 Claim, 4 Drawing Figures

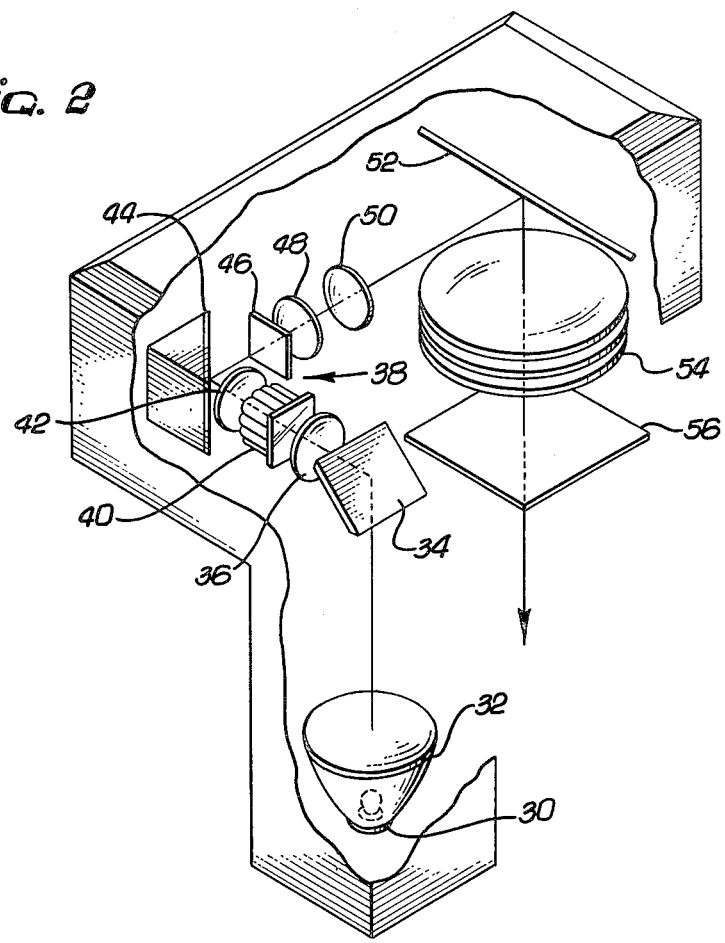
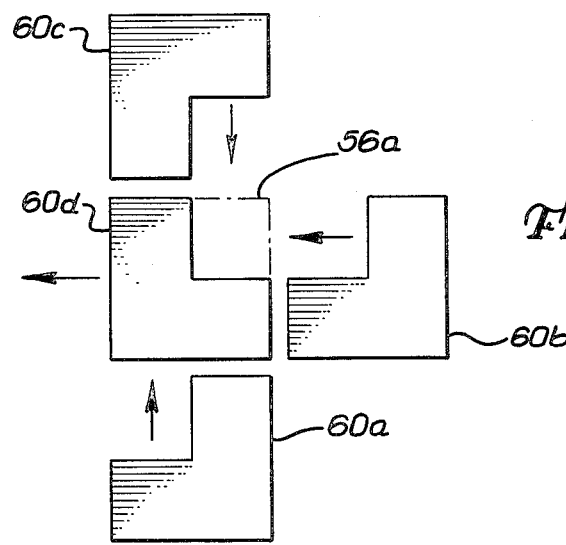

MIXER COUPLING LENS SUBASSEMBLY FOR PHOTOLITHOGRAPHIC SYSTEM

BACKGROUND OF THE INVENTION

1. Field of the Invention

This invention relates to machines which are used to form semiconductor devices by means of photolithographic techniques. In such systems, light of a predetermined wavelength is projected through a transparent mask (also referred to as a reticle) which has a circuit pattern formed on it. The light is then passed through a reduction lens and an image of the circuit pattern is projected and exposed onto a semiconductor wafer which is coated with photoresist. Generally, a device is formed by successively exposing different mask patterns onto a wafer in an overlapping fashion. The present invention is directed to the illumination system which is used to project light through the mask.

2. Description of the Prior Art

A typical prior art system for illuminating a mask is shown in FIG. 1. This system includes a mercury arc lamp 10 located within an aconic reflector 12. In conjuction with the reflector, the lamp provides a light output which has a Gaussian distribution of energy from the center to the edge of the illumination area (i.e., the intensity at the center of the illumination area is much greater than at the edge). The light is passed through a series of reflectors and filters, indicated generally at 14, where unwanted wavelengths are removed. The light is then passed through a light mixer subassembly 16 which includes a matrix of stick lenses (i.e., lenses in which the ratio of length to diameter is large). Photosensitive materials which are employed in the photolithographic process are very light sensitive, and it is critical that light striking the coated wafer be of relatively uniform intensity. The function of the light mixer subassembly 16 is to even out the light distribution so as to reduce intensity deviation throughout the illuminated area to less than about ten percent. Light from the mixer subassembly is passed through a combining lens 18. Light from the combining lens is then passed through a transfer lens assembly 20 and directed toward a mask 22. The mask is a transparent plate which includes a circuit pattern formed thereon, and the light from the lamp 10 illuminates the patterns and causes an image of the circuit to be projected and exposed onto a semiconductor wafer (not shown). Typically, the circuit image is projected through a reduction lens and the image exposed onto the wafer is smaller than the mask pattern by a factor of about ten.

In order to define the area of the mask 22 which is to be illuminated, an assembly known as a reticle edge masking assembly 24, or REMA, is positioned adjacent the mask 22. The REMA includes four blades 24a-d which are orthogonally positioned and are movable in order to define the size of a rectangular opening 26. Opposing blades are driven with a motor and a series of pulleys (not shown) so that they move at a constant rate.

The REMA assembly of the prior art has several disadvantages associated with it. Primary among these is the problem of near field diffraction or Fresnel effects. The mask 22 is located in a focal plane of the lens assembly of the illumination system, and light from the individual stick lenses of the mixer subassembly 16 will be focused at the mask plane. Light striking the REMA will be diffracted somewhat, thereby resulting in blurring at the edges of the illuminated area. This problem can be substantially overcome by locating the REMA extremely close to the mask plane; however, the physical constraints of the system are such that it is not possible to locate the REMA as close to the mask plane as desired. Because the REMA must be located as close as possible to the mask plane, the structure of the assembly must be relatively simple. In certain applications it may be desirable to produce illumination patterns other than a rectangle centered with the circuit pattern (e.g., a circular or rectangular illumination configuration which illuminates only a quadrant of the mask pattern may be desired). The structural limitations of prior art systems effectively prohibit the design of a REMA with such multiple illumination patterns.

Thus, the prior art REMA assembly is located as close as possible to the mask plane and operates by silhouetting the illumination which is projected toward the mask plane. This type of operation results in edge blurriness caused by near field diffraction. As manufacturing techniques improve, the fineness of the illumination pattern projected onto the mask becomes critical. Present systems operate with micron tolerances, and the blurring effects at the edges of the illumination patterns can adversely effect the operation of a system.

SUMMARY OF THE INVENTION

The present invention is directed to an illumination assembly in which a predetermined illumination pattern is projected onto the mask rather than silhouetted as in prior art systems. This is accomplished by providing an additional lens assembly which receives light from the light mixer subassembly and focuses it at an internal focal plane. A REMA assembly is positioned at this internal focal plane. The REMA thus defines the shape of illumination which passes through the internal mask plane. The illumination pattern defined by the REMA blades is reimaged at the mask plane. Since the REMA is located in a focal plane corresponding to the mask plane, the illumination pattern which is projected onto the mask plane is very accurate and edge blurring is minimized. Problems of near field diffraction or Fresnel interference are eliminated. In addition, since the REMA need not be located immediately adjacent the mask plane, the system can be designed to use more elaborate REMA assemblies than had previously been possible.

BRIEF DESCRIPTION OF THE DRAWINGS

In the drawings

FIG. 2 is a perspective diagrammatic view of the present invention; and

FIG. 4 is a plan view of a REMA assembly having four L-shaped blades.

DESCRIPTION OF THE PREFERRED EMBODIMENT

Figure 1:
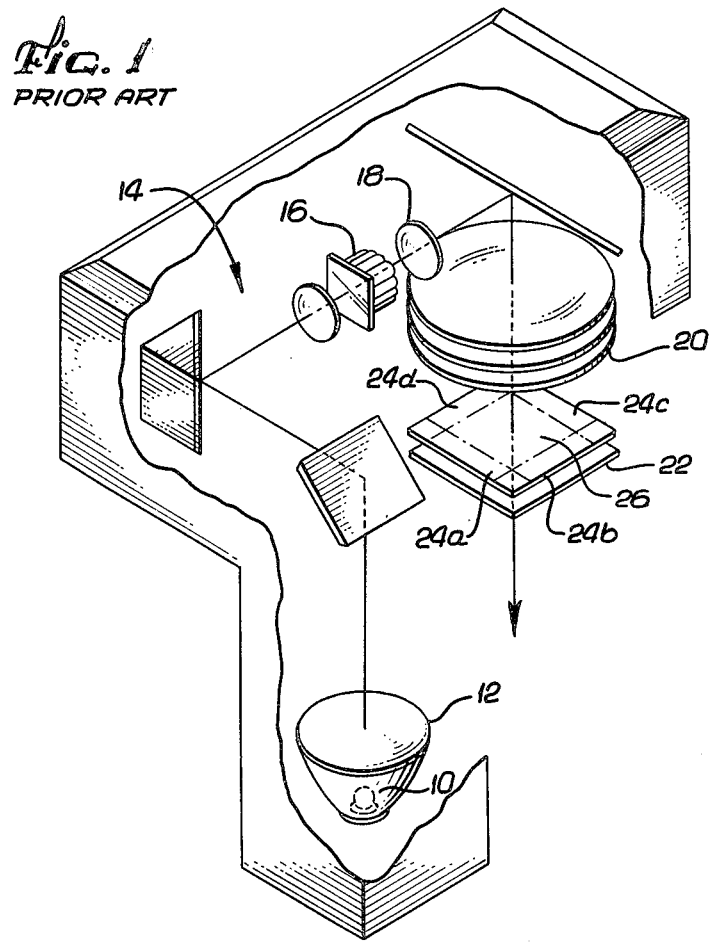
FIG. 1 is a perspective diagrammatic view of a prior art illumination system.
Figure 3:
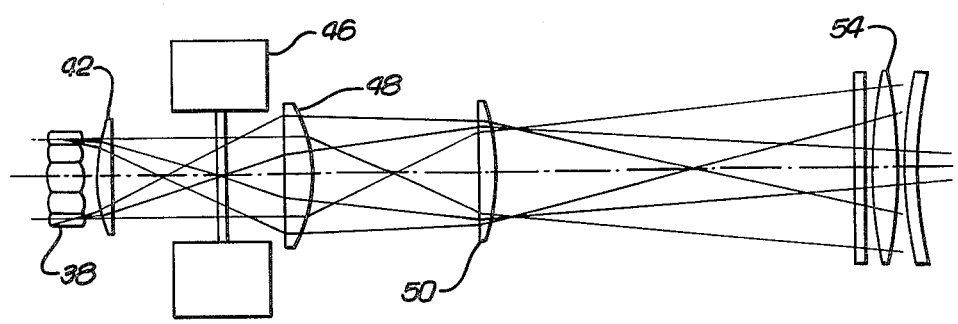
FIG. 3 is a plan view showing the optical configuration of the present invention.

Referring to FIG. 2, the present invention includes a mercury arc lamp 30 and aconic reflector 32 which directs light having a Gaussian distribution to a "cold" mirror 34, which filters out particular wavelengths from the projected light. Light from the mirror 34 is passed through a "hot" mirror 36, which filters additional wavelengths. The use of such mirrors to provide light of a predetermined wavelength is well known in the art. The filtered light is passed through a light mixer subassembly 38 having a matrix of stick lenses 40. The mixer subassembly evens out the illumination from the lamp so as to provide substantially uniform intensity over the area of illumination. Light from the mixer is passed through a first combining lens 42 and reflected from a reflector 44. The combining lens 42 has a focal plane located a small distance from the reflector 44. It is in this focal plane that the blades of a REMA assembly 46 are located. The REMA assembly may simply include four movable rectangular blades as shown in FIG. 1. Alternatively, more complex REMA assemblies, such as four L-shaped blades or blades which can be moved to produce a circular pattern, may be employed.

Light passing through the opening defined by the REMA 46 is passed through a field lens 48 and subsequently to a second combining lens 50. Light from the combining lens 50 is reflected from a reflector 52 through a transfer lens assembly 54 and strikes a mask 56 which is located at a focal plane corresponding to the focal plane at which the REMA is located. Light from the lamp will be focused both at the REMA plane and the mask plane.

The present invention thus provides an additional focal plane in the illumination system and the REMA assembly is located at that focal plane. The REMA opening serves to define a pattern of light which is projected through the second combining lens. This pattern of light is refocused at the mask plane. Since the system operates by projection rather than silhouetting, the desired mask illumination pattern is formed on the mask in a finely focused manner. Since the REMA need not be located adjacent the mask, space considerations become much less critical, i.e., there is more space available at the internal focal plane than there is adjacent the mask. The design possibilities for the REMA are thus substantially broader. Specific REMA assemblies which may be useful include those which produce a circular illumination pattern and those which include L-shaped blades that are movable to permit illumination of a predetermined quadrant of the mask. Such an assembly is illustrated in FIG. 4. The REMA includes four L-shaped blades 60a–d which are individually movable (by means not shown) so as to block off all but a quadrant 56a of the mask 56. The blade 60d is shown in position over the mask 56 in FIG. 4. In operation, the masks 60b and 60c would be moved to define a square opening with the blade 60d. Such a REMA assembly is useful for masks which contain a number of individual circuit patterns.

The present invention thus provides both increased performance (the illumination pattern on the mask is increased in precision) and increased flexibility in the design of the REMA. This increased flexibility becomes more important as photolithographic technology progresses. By providing a system with an additional focal plane and locating the REMA in that focal plane, the performance potential of the illumination system is greatly enhanced.

Although the invention has been described in terms of a preferred embodiment, various modifications will be apparent to those skilled in the art. For example, although the invention as described is for use with a projection apparatus for forming semiconductor devices, it could also be used in a pattern generator, i.e., an assembly which is used to actually form the circuit pattern on a mask. Such machines have similar requirements for a predetermined illumination pattern. The description therefore should not be taken in a limiting sense, but is made merely for the purpose of illustrating the general principles of the invention. The scope of the invention should therefore be determined by reference to the appended claims.

I claim:

1. A mask illumination system for use in the production of semiconductor devices, comprising:
   a lamp assembly;
   a first lens assembly for focusing light from the lamp assembly at a first focal plane;
   an edge masking assembly located at the first focal plane for causing light from the lamp to be formed into a predetermined pattern, said edge masking assembly including four movable blades positioned in said first focal plane which are movable to define a central aperture through which light from the lamp may pass, said blades blocking any light from the lamp directed to the first focal plane outside of the central aperture;
   a second lens assembly for focusing a light passing through the edge masking assembly onto a second focal plane at which a transparent mask having a circuit pattern thereon is located, wherein light will be projected onto the mask in accordance with the pattern of the central aperture defined by the blades.

* * * * *